US005362242A

United States Patent [19]

Nakamura

[11] Patent Number: 5,362,242

[45] Date of Patent: Nov. 8, 1994

[54] JUNCTION BOX AND TERMINAL TO BE USED IN THE JUNCTION BOX

[75] Inventor: Masayoshi Nakamura, Yokkaichi, Japan

[73] Assignee: Sumitomo Wiring Systems, Ltd., Yokkaichi, Japan

[21] Appl. No.: 998,678

[22] Filed: Dec. 30, 1992

[30] Foreign Application Priority Data

Jan. 10, 1992 [JP] Japan .................................. 4-000577

[51] Int. Cl.[5] .............................................. H05K 5/00

[52] U.S. Cl. ...................................................... 439/76

[58] Field of Search .................................... 439/45–48, 439/76, 621; 361/395, 399, 414, 357, 641, 642, 648–650

[56] References Cited

U.S. PATENT DOCUMENTS 3,286,220 11/1966 Marley et al. ........................ 439/533
4,703,397 10/1987 Minoura .............................. 361/399
4,850,884 7/1989 Sawai et al. ............................ 439/76
4,952,753 8/1990 Hayashi et al. ...................... 361/399

FOREIGN PATENT DOCUMENTS 1585463 3/1981 United Kingdom .

*Primary Examiner*—Neil Abrams
*Attorney, Agent, or Firm*—Sandler, Greenblum & Bernstein

[57] ABSTRACT

A junction box for connecting a fuse or relay through bus bars, wherein the bars include conductive members provided on a face of a case and are laminated within an accommodating portion within the case. A male tab is formed on an other side of the junction terminal for connecting the fuse or relay, the male tab of the junction terminal projects into the connector engaging portion provided on the other face side of the case through an opening and extends serially through the laminated bus bars, and is adapted to connect a connector directly with the male tab.

3 Claims, 4 Drawing Sheets

JUNCTION BOX AND TERMINAL TO BE USED IN THE JUNCTION BOX

BACKGROUND OF THE INVENTION

1. Field of the Invention

The present invention generally relates to an electrical junction box (branch junction box) to be used in the connection of many fuses, relays, etc., and a junction terminal to be used in the junction box, and especially, to simplify circuit construction within the junction box.

2. Background and Material Information

Conventional junction boxes for collectively connecting many fuses, relays, etc. are used in accordance with the sudden increase of necessary battery capacity and electrical components to be mounted for use in wire harnesses for automobiles.

In this type of junction box, as shown in FIG. 9, fuse engaging portions 3 project from the upper case 2 of the junction box 1 and connector engaging portions 5 project from the lower case 4, with many bus bars 6 being laminated within the case interior to be formed by the upper case 2 and the lower case 4.

When the fuse 7 to be mounted on, for example, the fuse engaging portion 3, is connected with a connector 8 to be mounted on the connector engaging portion 5 in the above described junction box, one end of the junction terminal 9 is connected with a tab 6a projecting upwardly from the respective bus bar 6 so as to connect the fuse 7 with the other end of the junction terminal 9, and connect the connector 8 with the tab 6b projecting downwardly from the above described bus bar 6.

In particular, the current flow of the conventional circuit is from fuse 7 to junction terminal 9 to bus bar 6 to connector 8.

As the conventional circuit flow is complicated, especially the upward and downward projecting tabs of the bus bars which become a through circuit and which are positioned onto the connector and the fuse connection side, the amount of control and management of the bus bars is increased so as to make the assembling operation accordingly complicated. When the flow of the circuit becomes complicated as described above, waterproofing and draining also become complicated, thus resulting in problems even in terms of electric connection and heating.

SUMMARY OF THE INVENTION

Accordingly, the present invention has been developed with a view to substantially eliminate the above discussed drawbacks inherent in the prior art and has for an essential object to provide an improved junction box.

Another important object of the present invention is to provide an improved junction box which removes bus bars which become a through circuit, reduces the number of layers of the bus bars, simplifies the assembling steps, and reduces the number of the steps of conducting the bus bars.

In accomplishing these and other objects, a junction box for connecting through bus bars includes conductive members to be mounted on the engaging portion provided on the external face of the case are laminated within the case; a male tab is formed at a reverse terminal of the junction terminal for connecting fuses, relays, etc. to be mounted on the engaging portion on one side face of the case; the male tab of the junction terminal projects to the connector engaging portion provided on the other side face of the case and serially extends through an opening portion extending through the laminated bus bars, and is adapted to connect the connector directly with the male tab.

The above described junction terminal has a receptacle shaped contact portion provided, which is composed of a pair of elastic engaging pieces for grasping the tab shaped contact portion at one end side of the slender flat plate portion. The flat plate portion is formed as the male tab for connection on the other end side. A tab shaped contact portion of a fuse, a relay, etc. is inserted into the above described receptacle shaped contact portion for connection, so that the above described male tab is adapted to be directly connected with the connector or the like.

When the junction terminal for directly connecting, without a through circuit is composed of bus bars, the above described fuse and/or relay and the connector are used adjacently in the fuse and/or the relay engaging portion. The male tab for connector use projects in parallel so that the connector may be made of multiple electrodes.

As a fuse is formed at its end, a male tab for connector use is formed on the other end of the junction terminal to be connected with the relay, and the male tab extends through the opening formed in the bus bars so as to project to the connecting engaging portion, and accordingly, the bus bars which had been through circuits can be eliminated.

The number of layers of the bus bars can be considerably reduced by the abolition of the bus bars which become a through circuit. The assembling operation of the bus bars can be simplified and the number of the conducting operations of the bus bars can be reduced. The number of layers of the bus bars is reduced to expand the gap between bus bars, so that the electrical connection and heating operations can be improved.

BRIEF DESCRIPTION OF THE DRAWINGS

These and other objects and features of the present invention will become apparent from the following description of preferred embodiments thereof with reference to the accompanying drawings, in which.

DETAILED DESCRIPTION OF THE PREFERRED EMBODIMENTS

Figure 1:
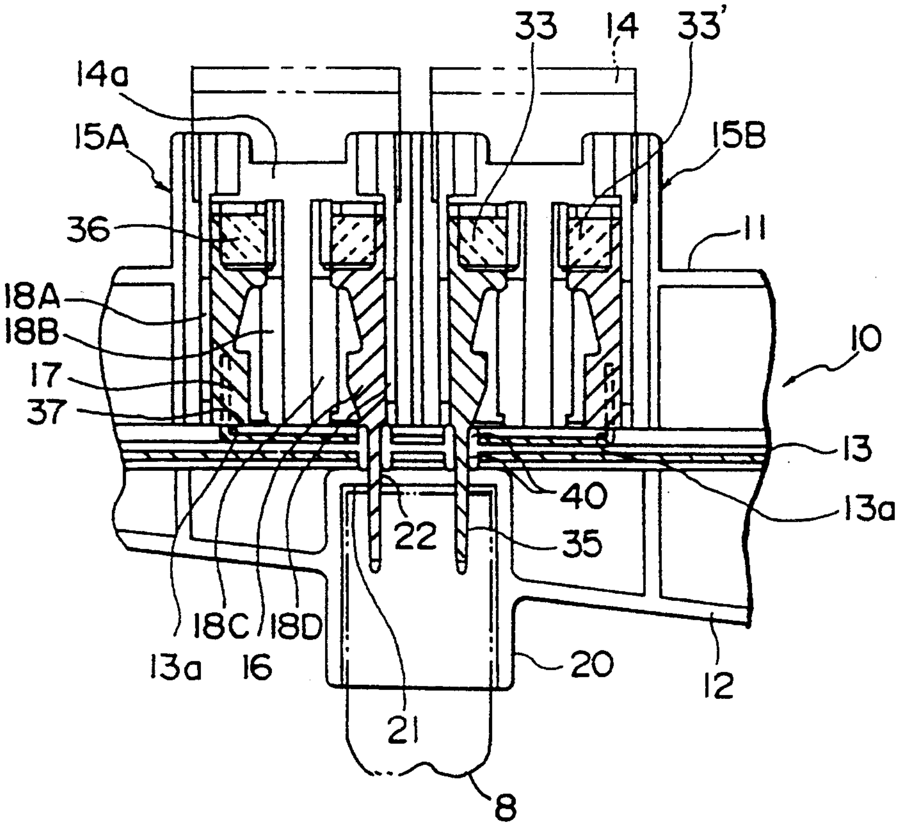
FIG. 1 is a sectional view of a first embodiment of the present invention.
Figure 2:
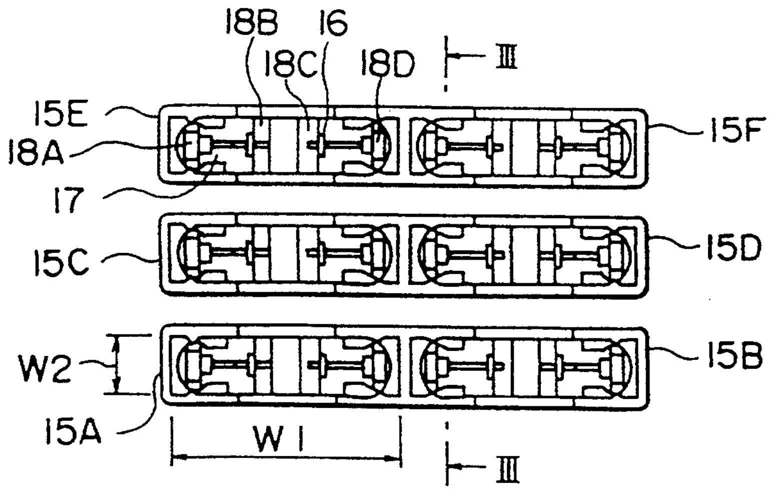
FIG. 2 is a plan view of the above described first embodiment.
Figure 3:
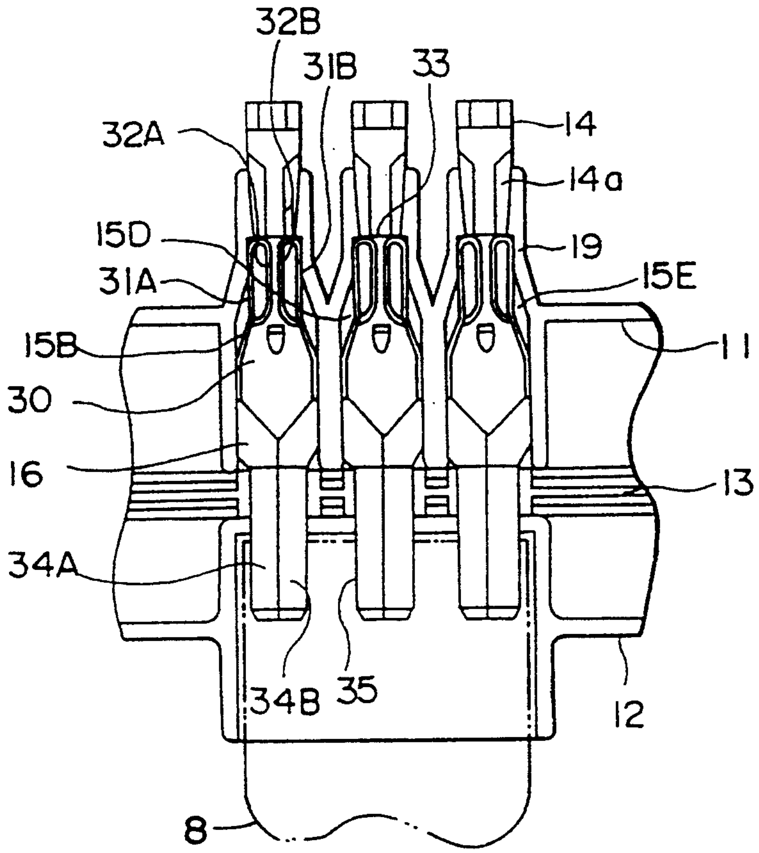
FIG. 3 is a sectional view taken along line III—III of FIG. 2.
Figure 4:
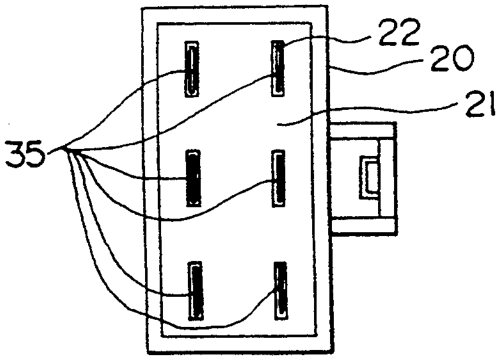
FIG. 4 is a bottom view of a connector engaging portion of the above described first embodiment.
Figure 5B:
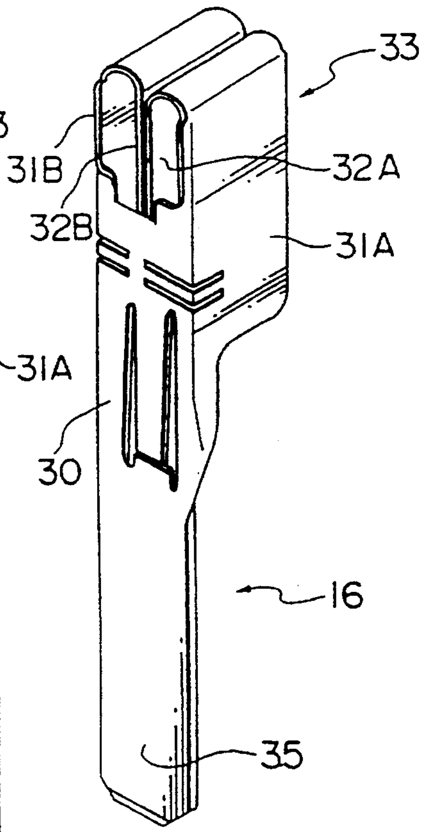
FIGS. 5 (A) and 5(B) show perspective views of another embodiment of a junction terminal.
Figure 5A:
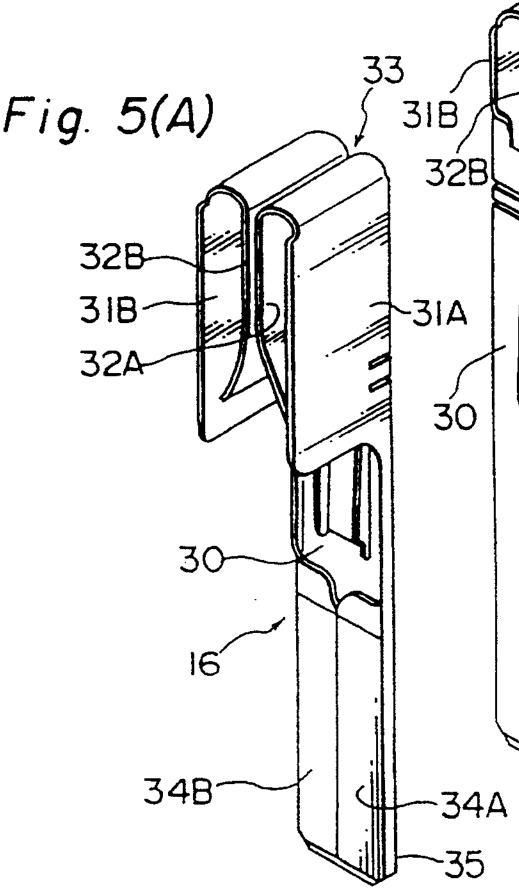
Figure 9:
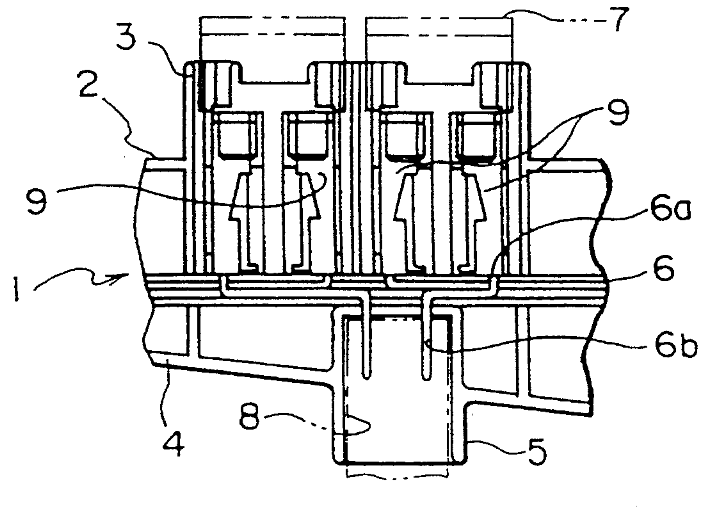
Fig. 9 PRIOR ART
FIG. 9 is a sectional view showing a conventional embodiment.

Before the description of the present invention proceeds, it is to be noted that like parts are designated by like reference numerals throughout the accompanying drawings.

The present invention will be described hereinafter in detail in accordance with the embodiments shown in the drawings.

FIG. 1 through FIG. 4 show a first embodiment of the present invention. A junction box 10 is composed of an upper case 11 and a lower case 12 as shown, and has therein an accommodating portion with laminated bus bars Six fuse engaging portions project upwardly in adjacent relation from the connecting portion between the fuse and the connector of the above described junction box 10 with fuse engaging portions 15A through 15F for inwardly engaging two leg shaped fuses 14 on the side of the upper case 11 in two columns and three front and rear rows.

The above described respective fuse engaging portions 15A though 15F are formed with two junction terminals 16 and 17 which can be mounted at a length W1 in the right and left lateral directions and also, has partition walls 18A through 18D capable of retaining the junction terminals 16 and 17 therein. The width W2 in the front rear directions is set to be capable of engagingly retaining the respective junction materials 16, 17. The projection tip end portion 19 is formed in the shape of the junction terminals 16, 17. When the junction terminals 16, 17 are engaged within the fuse engaging portions 15A through 15F, they are adapted to be positively retained in the predetermined position.

The above described projecting tip end portion 19 forms an opening portion for inwardly engaging a lower portion 14a of the fuse 14.

One concave shaped connector engaging portion 20 downwardly projects, near the insulating base plate of the bus bar 13 which is in the lowermost layer in the lower case 12 in a position opposite to the above described fuse engaging portions 15A through 15F. Six holes 22 are drilled at predetermined intervals in the bottom face portion 21 of the connector engagement portion 20. The six male tabs of the junction terminal 16 can project so as to be mounted on the inner side where they mutually approach from the junction terminals to be respectively mounted on the above described fuse engaging portions 15F through 15F.

The junction terminals 16, 17 connect the fuses with the connectors through the bus bar 13, with one junction terminal 16 as described above. The other junction terminal 17 is, at its one end, connected to the fuse, and at the other end, is adapted to be connected with the rising tab 13a from the bus bar 13. The junction terminals 16, 17 are formed with the conductive metallic plates being bent.

The junction terminal 16, with attached male tabs, includes one terminal side of the slender flat plate portion 30 being bent from both the side end edges thereof, and is folded back in a mutually adjacent inward direction. Projection portions project upwards from the bent portions 31A, 31B so as to form the folded back portions as a pair of elastic nipping pieces 32A, 32B. A receptacle shaped contact portion 33 is to be connected to a tab shaped contact portion to be inserted into a gap between the elastic nipping pieces 32A and 32B. A flat plate shaped male tab 35 is formed by a flat plate portion 30 and folded plate portions 34A, 34B, with both the sides of the flat plate portion being overlapped onto the flat plate portion on the other side. The male tab 35 is long enough to extend through the bus bar 13, which is formed in layers so as to extend to the connector engaging portion 20.

The above described junction terminal 16, with a male tab attached thereto, is mounted on the mutually adjacent side of the above described fused engaging portions 15A through 15F. Also, a second or normal junction terminal 17 is mounted on the external side. The second junction terminal 17 has receptacle shaped contact portions 33, 37 provided on opposite ends.

The above described junction terminal 16 is mounted so that the male tab 35 may project downwards through opening portions 40, which serially extend through the laminated bus bars 13, corresponding to the projection portion of the tab 35. The male tab 35 extends through the opening portions 40 and extends through the hole 22 of the connector engaging portion 20 into the connector engaging portion 20. Accordingly, the male tabs 35 project in two columns and three longitudinal rows into the interior of the connector engaging portion 20.

Two leg shaped fuses 14 are inserted into the respective fuse engaging portions 15A through 15F with respect to the junction box 10 of the above described construction. One tab shaped contact portion 36 projecting from a lower portion of these fuses 14 is inserted between a pair of elastic engaging pieces 32A and 32B of the receptacle shaped contact portion 33 of the junction terminal 16 and is connected so that electric contact is retained. The other tab shaped contact portion of the fuse 14 is also connected with the receptacle shaped contact portion 33′ of the junction terminal 17.

The male tab of the terminal on the other end side of the above described junction terminal 16 projects from the hole 22 of the connector engaging portion 20 on the lower side of case 12. The male tab is connected with the female engaging portion (not shown) of the connector 8 by the insertion of the female engaging portion into the connector engaging portion 20. In particular, the fuse 14 and the connector 8 are connected through the junction terminal 16, instead of a through circuit of the bus bars 13.

The male tab 13a rising from the bus bars 13 is connected with the receptacle shaped contact portion 37 at the lower end of the second junction terminal 17.

Since the male tab for connector use is formed at a reverse terminal of the junction terminal to be connected with the fuse, bus bars which are through circuits are not used, so that the fuse 14 and the connector 8 are directly connected with each other.

The fuses are arranged in two columns, and a junction terminal provided with the male tab as described above are disposed on the opposite side of the circuit so that he connector side may be made of a plurality of electrodes.

The shape of the junction terminal 16, with a male tab being attached thereto may be made in the shape of a flat plate of the same length across the whole length direction, as described, without any restriction in the above described embodiment. As the other described construction is the same as the junction terminal 16 in the first embodiment, the description of the same elements is omitted.

Figure 6:
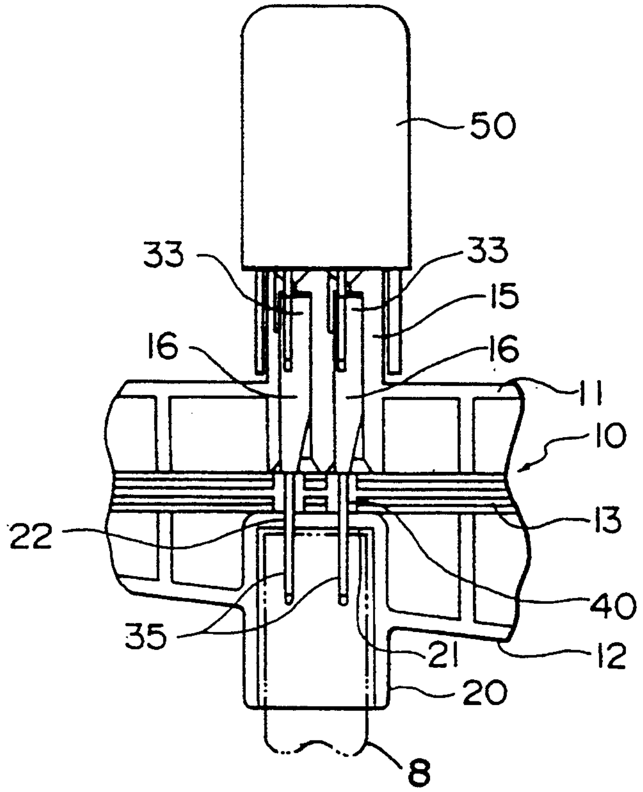
FIG. 6 is a sectional view of another embodiment of the present invention.
Figure 7:
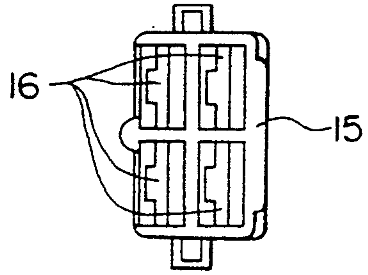
FIG. 7 is a partial plan view of FIG. 6.
Figure 8:
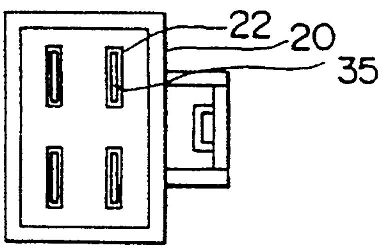
FIG. 8 is a partial bottom view of FIG. 6.

The junction terminal provided with a male tab for connector use being attached thereto is not used only for the connection between the fuse and the connector, but also can be also preferably used for a connection between the relay 50 and the connector as shown in the second embodiment in FIGS. 6–8. As the construction is the same as the first embodiment, the description of the same reference numerals being given to the like parts will be omitted.

As is clear from the foregoing description, according to the arrangement of the present invention, a male tab for connector use is integrally formed with the other end of the junction terminal for connecting one end with the fuse, a relay, etc. The male tab is formed, without connection to the bus bars, extends through an opening portion, projects into the connector engaging portion, and is connected directly to the connector, so that the bus bars which become through circuits can be eliminated.

When the bus bars which become through circuits are eliminated as described, the number of the bus bars to be laminated into the junction box can be normally reduced by half.

If the number of the bus bars are so reduced the assembling operation can be simplified, and also, the steps of conducting the bus bars can be reduced. The waterproofing and draining operations can also be simplified, and the gap among the bus bars can be made larger. The electrical connection and heating can also be improved.

Although the present invention has been fully described by way of examples with reference to the accompanying drawings, it is to be noted that various changes and modifications will be apparent to those skilled in the art. Therefore, unless otherwise stated that such changes and modifications depart from the scope of the present invention, they should be construed as included therein.

What is claimed is;

1. A junction box for connecting at least one of a fuse and relay to a connector through bus bars, said junction box comprising: a case, a plurality of bus bars including conductive members mounted on an engaging portion provided on a surface of said case, said bus bars being laminated in an accommodating portion within said case, and a junction terminal including a male tab having a contact portion formed on an end of said junction terminal for connecting to said at least one of a fuse and relay to be mounted on the engaging portion of said case, the male tab of the junction terminal projecting to a male connector engaging portion provided on an opposed surface of the case through an opening portion extending serially into said laminated bus bars, and adapted to directly connect said connector with the male connector of the male tab.

2. A junction box, according to claim 1 wherein said contact portion of said junction terminal comprises a receptacle shaped contact portion including a pair of elastic engaging pieces for grasping a tab shaped contact portion of said at least one of a fuse and relay, said receptacle shaped contact portion being provided at one end of a slender flat plate portion, the flat plate portion being extended and formed as said male connector, so that the male connector is adapted to be connected with said connector.

3. A junction box according to claim 1, further comprising a second junction terminal, said second junction terminal including a first engaging portion for connection to said at least one of a fuse and relay, and a second engaging portion for connection to at least one of said bus bars, whereby an electric circuit is formed through said at least one of said bus bars, said second junction terminal, said at least one of a fuse and relay, said junction terminal, and said connector.

* * * * *